SOLID STATE BISTABLE CIRCUIT

Filed Aug. 25, 1964 4 Sheets-Sheet 1

INVENTOR.
DONALD H. A. HAGEMAN,
BY
Robert Thompson
ATTORNEY.

INVENTOR.
DONALD H. A. HAGEMAN,
BY
Robert Thompson
ATTORNEY.

March 26, 1968 D. H. A. HAGEMAN 3,375,373

SOLID STATE BISTABLE CIRCUIT

Filed Aug. 25, 1964 4 Sheets-Sheet 3

INVENTOR.
DONALD H. A. HAGEMAN,
BY
Robert Thompson
ATTORNEY

INVENTOR
DONALD H.A. HAGEMAN,
BY Robert Thompson
ATTORNEY

United States Patent Office 3,375,373

Patented Mar. 26, 1968

3,375,373
SOLID STATE BISTABLE CIRCUIT

Donald H. A. Hageman, Los Angeles, Calif., assignor to Hughes Aircraft Company, Culver City, Calif., a corporation of Delaware

Filed Aug. 25, 1964, Ser. No. 391,957
6 Claims. (Cl. 250—209)

This invention relates to a solid state switching device and more particularly to an improved thin film bistable switch having increased switching speed.

Heretofore the matching of certain integrated circuit elements has been a problem. For example, the use of semi-conductor bistable switches with thin film circuits is not altogether practical because of heating problems—even in the quiescent state—and critical manufacturing requirements for predictable operation. These problems are especially troublesome in integrated circuit arrays having many bistable switches. Even where compatible bistable semiconductor switches have been made, it has been preferable to manufacture the bistable switches independent of the thin film circuit, to test for good switches, and to thereafter interconnect the switches and the circuit.

The use of thin film switches comprising electroluminescent substances in conjunction with photo-conductive substances has, in the past, provided an approach to solving these circuit matching problems. Where it has been possible to create such switches of these substances an additional problem has arisen regarding the switching speed or response time of the materials used.

Accordingly, it is an object of this invention to provide an improved, simple, reliable, solid-state bistable switching device which is compatible with thin film circuitry and integrated circuitry techniques.

Another object of this invention is to provide an electrically responsive electroluminescent-photoconductive bistable memory device.

Still another object of this invention is to increase the switching speed or response time of thin film switching devices.

Still another object is to provide a solid state bistable circuit which requires low power expenditures and is not readily subjected to internal heat problems during either stable state.

A further object is to provide a thin film, nondestructive-readout, memory device which has random access operating characteristics.

The above and other objectives of this invention can be accomplished by providing a plurality of electroluminescent members (EL) and photoconductive members (PC) which are both electrically and optically coupled together in a select manner so that selective electrical energization of the elements results in bistable changes of the state of the members and in which the output thereof is selectively read by electrical interrogation pulses applied to certain elements.

More specifically, the above-described bistable switching operation is accomplished by providing a stacked laminae of semitransparent thin film conductor layers and semitransparent thin-film insulator layers which are selectively arranged relative to one another to provide optical and electrical coupling between the certain photoconductive layers (PC) and photoelectric layers (EL). A plurality of electrical terminals which are connected to these members through an encasing opaque laminae are selectively energized so that the bistable switching operation, and the interrogation of the stacked laminae, to determine the stable state, can be accomplished independently of any other similar stacked laminae connected in circuit with it. As a result of this unique structure the switches can be connected into logic arrangements to provide a memory array to which random access can be gained with a nondestructive-readout.

In order to increase the speed of response of these thin film members, electrical energy can be supplied only to the surfaces of each photoconductive member by means of a pair of complementary fingered or forked conductor members extending across the face thereof in an interlocking interspaced relationship.

Other objects, features and advantages of this invention will become apparent upon reading the following detailed description of several embodiments of this invention and referring to the accompanying drawings, in which:

FIG. 1 is a block diagram of a bistable switch showing the optical and electrical coupling between independent electroluminescent and photoconductive elements;

FIGS. 2*a* and 2*b* are graphs of the electrical waveforms of a typical switching sequence in which FIG. 2*a* represents a binary "1" write and FIG. 2*b* represents a binary "0" write;

Figure 4:
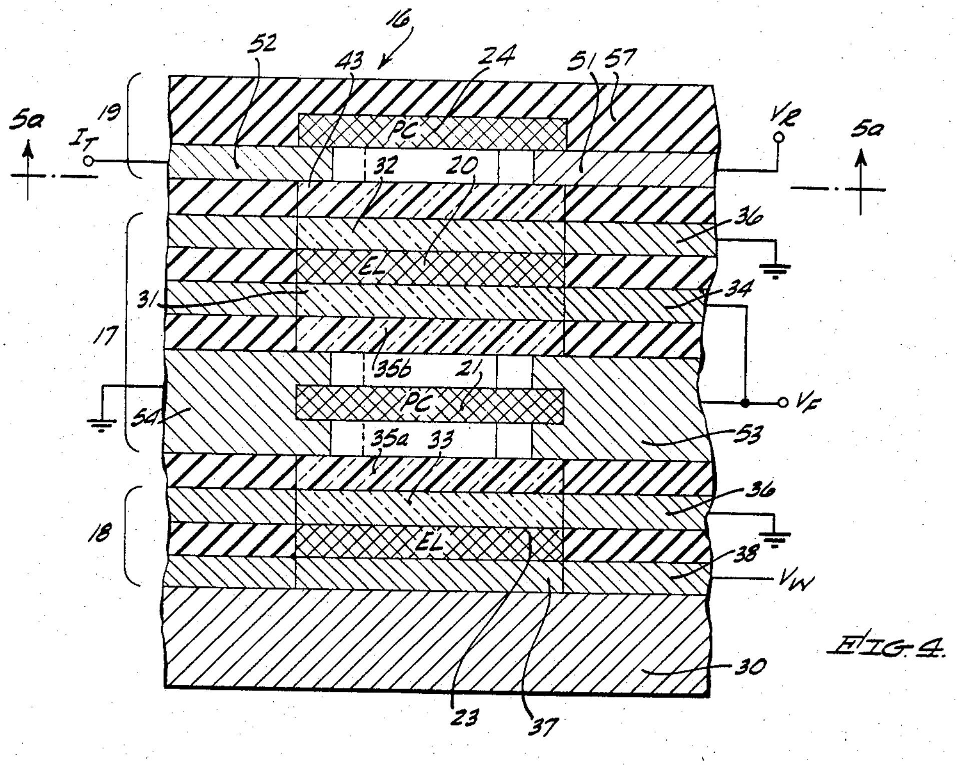
FIG. 4 is a cross-sectional, side-elevational view illustrating preferred features of the bistable switch illustrated in FIG. 1.
Figure 5A:
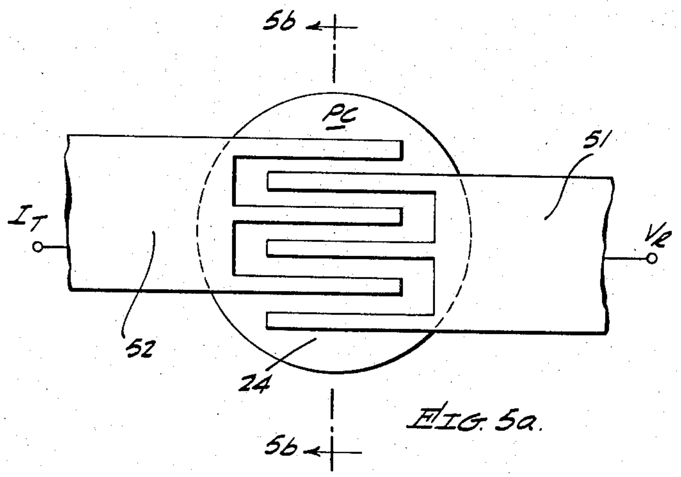
Figure 5B:
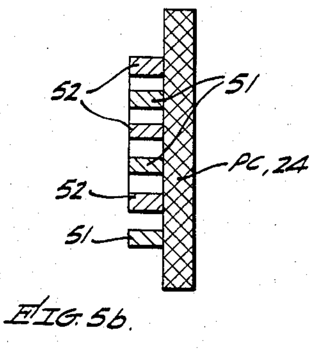
Figure 6:
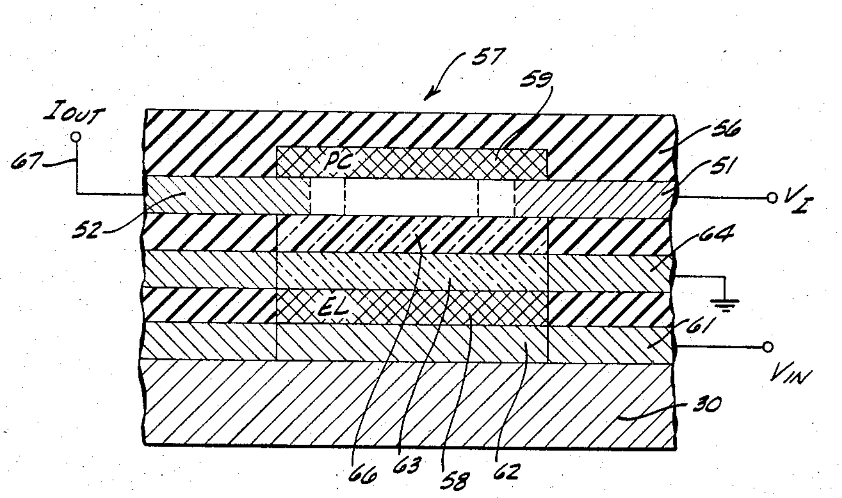
Figure 7:
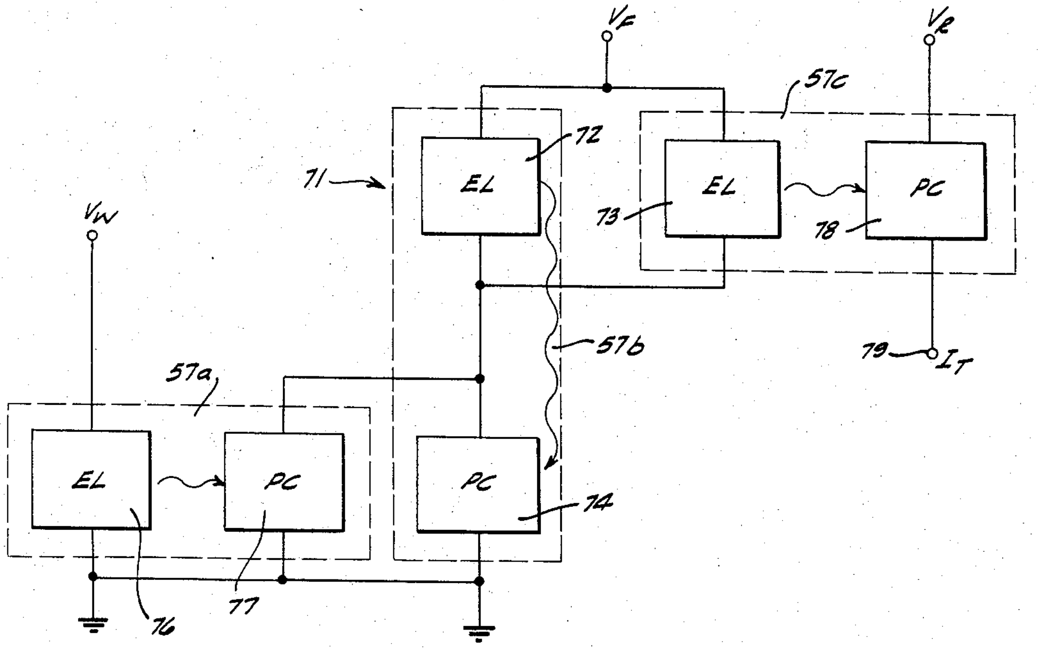
Figure 8:
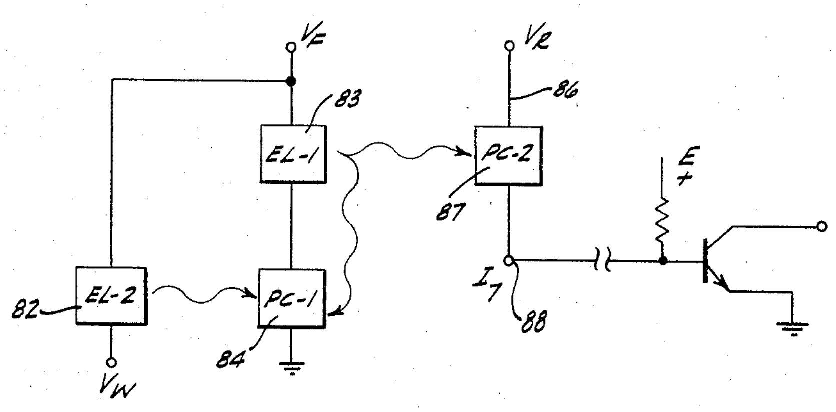
Figure 9A:
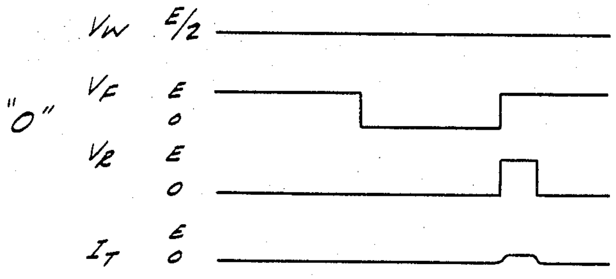
Figure 9B:
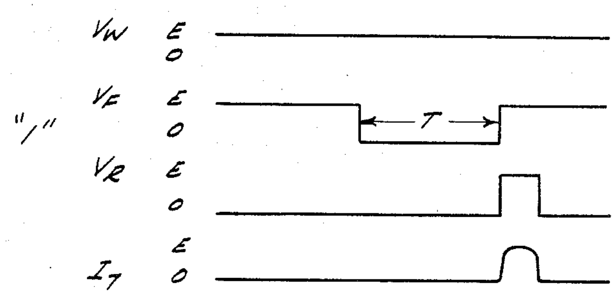
Figure 10:
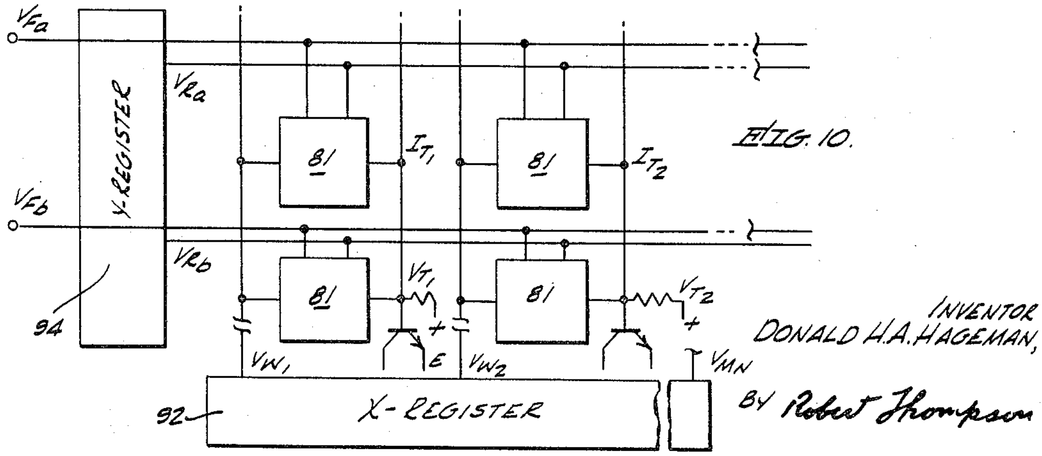

FIG. 5*a* is a plan view of one layer as seen by separating the laminated assembly along the line 5*a*—5*a* of FIG. 4, and FIG. 5*b* is a cross-sectional view of the layer taken along the line 5*b*—5*b* of FIG. 4, both figures illustrating a finger-type current supply feature to the layer;

FIG. 6 is a cross-sectional view of a different thin film unit embodiment of the invention comprising one electroluminescent element and one photoconductive element;

FIG. 7 is a block diagram of one arrangement for the unit of FIG. 6;

FIG. 8 illustrates a block diagram of another binary switching arrangement;

FIGS. 9*a* and 9*b* are graphs illustrating a switching pulse arrangement for changing the state of the switch of FIG. 8 to a "0" or a "1" respectively; and FIG. 10 is a schematic circuit diagram of a memory matrix using the bistable switches of FIG. 8 and the pulse technique of FIGS. 9*a* and 9*b* for random access storage.

Figure 1:
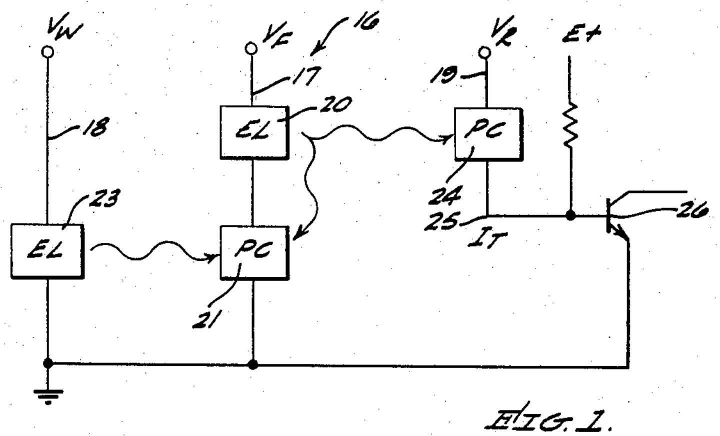

Referring now to FIG. 1, there is illustrated a block diagram of an electroluminescent-photoconductive bistable switch 16. By way of definition, electroluminescence (EL) is commonly designated as nonlinear "cold light" emission from a substance resulting from an electrical field being applied to the substance. The term "cold light" or luminescence usually means the emission of visible light from a substance which is at an insufficient temperature to emit spontaneous light or incandesce. One group of substances which exhibit these characteristics is the phosphor family. The term "photoconduction" (PC) is usually designated as nonlinear changes in conductance of a substance in direct relation to changes in the intensity of visible or nonvisible radiation impinging on the substance. Some applicable photoconductive substances would include silicon or germanium photodiode materials. Further discussion of these phenomena can be found in Proceedings of the IRE, December 1955, entitled "Opto-Electronic Devices and Networks" by E. E. Loebner, pp. 1897–1906.

Structurally, the bistable switch 16 comprises three parallel branches including a bistable branch 17; a write branch 18, which is optically coupled to determine or control the state of the bistable branch 17; and a read branch 19 which in turn will produce an output signal $I_T$ when interrogated by a read pulse $V_R$ thereby indicating the state of the optically coupled bistable branch 17. More specifically, the bistable circuit branch 17 includes an electroluminescent member 20 (EL) which is maintained in the OFF or virtually dark condition at any time that a series connected photoconductive element 21 (PC) is in a dark or high resistance condition when an electrical signal $V_F$ of a predetermined voltage magnitude E is applied across the bistable branch.

In order to switch the stable state of the bistable branch 17, a write signal $V_W$ of magnitude E is applied across the write branch 18 to energize the write electroluminescent member 23 (EL). The luminescence so created is optically coupled to decrease the resistance of the photoconductive element 21 in the bistable branch 17. Hereafter, the elements in the bistable branch 17 will be referred to as the bistable electroluminescent element or member 20 and the bistable photoconductive member 21 for purposes of clarity where practical when describing the circuit operation.

When the resistance of the bistable photoconductive element 21 so decreases, the strength of the electrical field across the bistable electroluminescent element 20 increases, thereby causing bistable electroluminescent member 20 to luminesce. A portion of the luminescence created by electroluminescent element 20 is optically coupled or fed back to the bistable photoconductive element 21, thereby maintaining the resistance of photoconductive element 21 low to hold the bistable branch 17 in the ON or lit condition even after the write pulse signal $V_W$ is removed from the write branch 18. The luminescence of the bistable electroluminescent member 20 is also optically coupled to an output photoconductive element 24 which is connected in series in the read branch 19.

When luminescence from photoconductor 24 is thus received by the output photoconductor 24, the resistance of the read branch decreases, whereupon an interrogation pulse or signal $V_R$ applied across the read branch 19 will cause, as a result of a current dividing action, a corresponding variation in the current $I_T$ at an output transistor 26. Hereinafter the luminescent condition will be referred to as a binary "1" state. Conversely, when the bistable electroluminescent member 20 is dark, no luminescence is received by the output photoconductor 24 and the resistance of the read branch 19 remains high, whereupon interrogation pulses $V_R$ do not substantially vary the current $I_T$ at the output terminal 25. Hereinafter, this dark condition will be referred to as a binary "0" state. These output currents $I_T$ can thereafter be applied to the base terminal of an output transistor 26 to increase the power of the output signal. In configurations where transistors are not used and the output terminal has a resistive characteristic, the output signal $I_T$ would create a voltage change $V_T$ relative to ground because of a voltage dividing action.

Figure 2A:
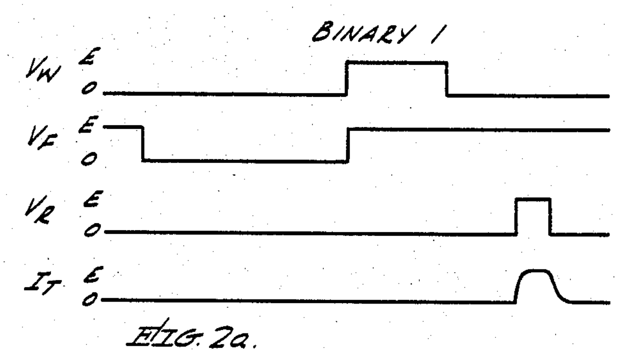
Figure 2B:
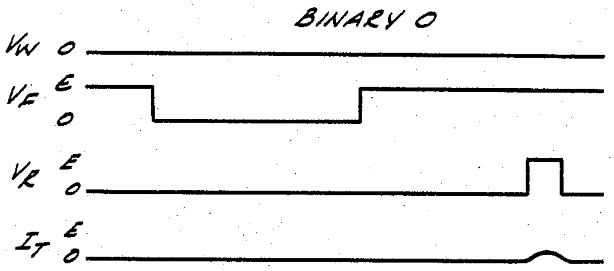

In order to accomplish the above described switching operations, voltage signals $V_W$, $V_F$ and $V_R$ can be applied to the bistable switch 16 in the exemplary manner illustrated in the voltage timing graphs of FIGS. 2*a* and 2*b*. In the quiescent or storage state the signals $V_W$ and $V_R$ are at zero volts relative to ground potential while the signal $V_F$ across the bistable branch 17 is at a potential E volts. Hereinafter all references to voltages are with reference to ground potential.

As previously mentioned, the magnitude of the signals $V_F$ should be sufficient to maintain the bistable electroluminescent element 20 and the bistable photoconductive element 21 in a bistable state (10 to 50 volts D.C.). That is, with photoconductor 21 dark or at high resistance, the electroluminescent element 20 is virtually dark. When, however, the photoconductive element 21 receives luminescence its resistance decreases to increase the electrical field across the electroluminescent element 20, causing the electroluminescent element 20 to change states and luminesce.

To write and read a binary "1" on the bistable switch 16, the voltage $V_F$ is first reduced to zero, thereby emptying any stored information from the bistable branch 17. The time interval required for this voltage decrease must only be long enough to allow the photoconductor 21 to recover its dark value and the electroluminescent member 20 to fall to a low luminescence level. By proper arrangement of the elements, as will be explained shortly, and proper choice of element materials, it is possible to reduce the required time interval when $V_F=0$ volts down to 2–6 microseconds. Once the bistable elements in the bistable branch 17 have attained their dark values, the voltage $V_F$ is again raised to the potential E, previously described.

At any time after the bistable branch 17 has attained its dark value, the signal $V_W$ appiled to the write branch 18 is increased to a magnitude E which causes the write electroluminescent element 23 to luminesce and transmit light to the bistable photoconductor 21. With the resultant decrease in resistance in the bistable photoconductor, the bistable electroluminescent member 20 is turned on, whereupon a portion of the luminesence is conducted or coupled down to the photoconductor 21, thereby maintaining it at a low resistance condition. At this time the write signal $V_W$ can be removed from the write branch 18.

The luminescence from bistable electroluminescent device 20 is also optically coupled to decrease the resistane in the output photoconductor 24 in the read branch 19. Thus, through current dividing action, any interrogation pulse $V_R$ applied across the write branch 19 causes a corresponding variation in the current $I_T$ at the output terminal 25. For example, for a binary "1" readout the magnitude of voltage $V_T$ must only be above a discrimination level. By properly arranging the material, as will be explained shortly, and properly choosing the element material, it is possible to use an interrogation pulse or read pulse $V_R$ as short as 1–2 microseconds.

For a binary "0" state, the quiescent or starting conditions are initially the same as in the binary "1" condition in that only the voltage $V_F$ is applied to the binary switch 16 and voltages $V_W$ and $V_R$ are at zero volts. In order to empty the bistable switch 16 prior to a write-read operation, the signal $V_F$ to the bistable branch 17 is first reduced to zero volts for a time period sufficient for the bistable electroluminescent element 20 and the bistable photoconductive element 21 to attain their dark values. Thereafter, the voltage $V_F$ is again increased to a potential E sufficient to operate the bistable electroluminescent element 20 and the bistable photoconductor element 21 in the manner previously described. Since, in the binary "0" state, no binary information is to be stored, no signal $V_W$ is received by the write branch 18. As a result, the bistable photoconductor 21 remains at its dark or high resistance value, thus maintaining the electrical field across the bistable electroluminescent element 20 at a low level which is insufficient to cause luminescence. Thus, no luminesence is received by the output photoconductor 24 and the resistance of the read branch 19 remains high. As a result of the voltage dividing action interrogation of the read branch 19 with a read pulse $V_R$ causes only a slight corresponding current variation $I_T$ at the output terminal 25. Through a proper choice of circuit parameters and operating voltages, the upper level of the binary zone output pulse $I_T$ is below a predetermined discrimination level.

Figure 3:
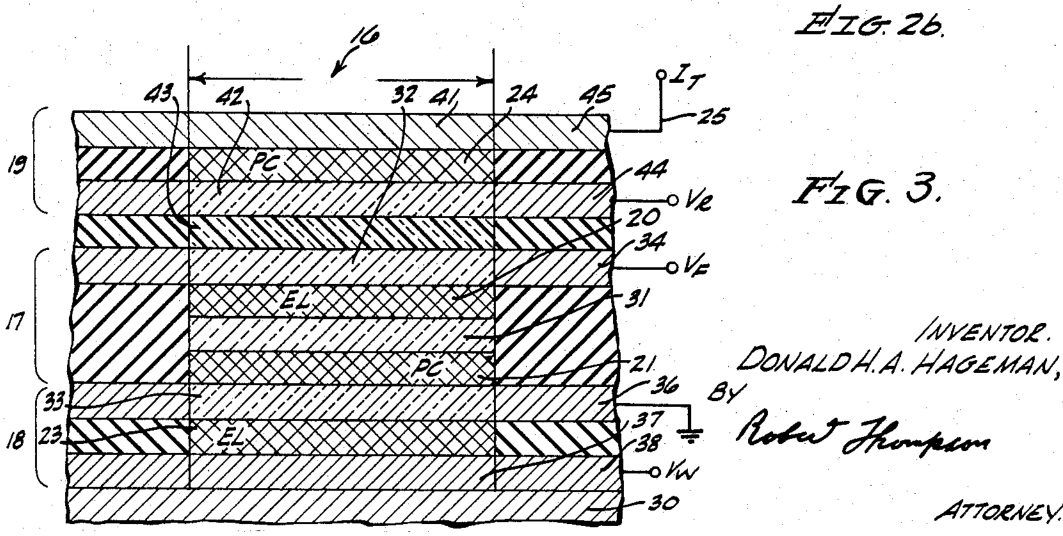
FIG. 3 is a cross-sectional view of a stacked laminae of the thin film elements arranged to operate in the manner of the switch of FIG. 1.

Referring now to FIG. 3 there is illustrated a bistable switch 16 in the form of a stacked laminae of superposed electroluminescent and photoconductive thin film substance which are optically coupled and electrically coupled to one another through semitransparent thin film stratum or layers in a specific manner to accomplish the bistable switching operation of the equivalent bistable switch illustrated schematically in FIG. 1. In addition, the stacked laminae of thin film members is encased by a stacked laminae of opaque conductors and insulators, and mounted on a dielectric ceramic substrata 30. As a result, the electric signals $V_W$, $V_F$ and $V_R$ can be supplied to the bistable switch 16 while all external or ambient light is excluded, thereby eliminating false signals.

In the thin film bistable switch of FIG. 3, reference characters of layers or stratum which function in a manner similar to the corresponding elements of FIG. 1 have been carried forward and are used consistently throughout the specification.

The thin film bistable switch 16 includes a central bistable strata 17, a lower write strata 18, and an upper read strata 19, all of which are each optically and electrically coupled through semitransparent layers so that they can be energized by the voltage signals $V_F$, $V_W$ and $V_R$ respectively. In order to provide for both semitransparency and electrical conduction the thin film electrode stratum can be of aluminum, gold or other materials and of a thickness range between 1 to 25 microns (not drawn to scale). The opaque insulators in the thin film strata surrounding bistable switch 16 have been left unnumbered for clarity of illustration. In addition, the diameter of the switch 16 could be one-half of a centimeter and still provide sufficient coupling between layers.

The thin film bistable strata 17 includes an electroluminescent stratum 20 and a photoconductive stratum 21 separated from one another by a thin film semitransparent electrode stratum 31. These three stratums are in turn sandwiched between an upper and a lower semitransparent thin film electrode stratum 32 and 33 respectively. An electrical signal $V_F$ is applied to this bistable strata 17 through an opaque thin film conductor 34 and the semitransparent electrode layer 32 and creates an electrical field normally or vertically through the strata to a ground terminal through the lower semitransparent electrode layer 33 and an opaque thin film conductor 36. As previously discussed with reference to FIG. 1, the magnitude of voltage $V_F$ should be sufficient to maintain the bistable electroluminescent member 20 and the photoconductive member 21 in one bistable state.

The state of the bistable strata 17 is controlled by the luminescent state of the write strata 18. Structurally the write strata 18 consists of a thin film luminescent stratum 23 which is sandwiched between the semitransparent thin film electrode 33 and a lower thin film opaque electrode 37. In operation, an electrical signal $V_W$ is selectively applied through a thin film opaque conductor 38 to a thin film electrode 37 and is directed normally or vertically through the write strata 18 to the semitransparent electrode 33 and then to the opaque thin film conductor 36 and a ground terminal. The signal $V_W$ applies an electrical field across the write electroluminescent member 23 whereupon it luminesces. The resultant light is optically coupled to the photoconductor 21 of the bistable strata through the semitransparent electrode 33. When the photoconductor 21 is so illuminated, its resistance decreases, thereby increasing the strength of the electrical field $V_F$ across the bistable electroluminescent stratum 20 which then luminesces. The luminescence of the bistable electroluminescent member is optically coupled both downward through the semitransparent electrode 31 to the bistable photoconductor 21 and upward through the semitransparent electrode strata 32 and insulator strata 43. Thus, the bistable electroluminescent member 20 is held in the bistable "1" condition even after the write signal $V_W$ is removed from the write strata 18.

The resistance of the read strata 19 is controlled by the luminescent state of the bistable strata 17. Structurally, the read strata includes an output photoconductive stratum 24 which is sandwiched between an upper opaque thin film electrode stratum 41 and a lower semitransparent thin film electrode stratum 42. In operation, the luminescence from the bistable electroluminescent stratum 20 is coupled to the output photoconductor 24 through the semitransparent electrode 32; the semitransparent insulator 43 made of a material such as silicon monoxide SiO, and the semitransparent electrode 42. Thus, when the read strata is interrogated by the read signal $V_R$ the resulting current flows through an opaque thin film conductor 44 upward normally through the output photoconductor 24, to an opaque thin film electrode 41 and an opaque conductor 45 to develop a corresponding current change $I_T$ at the output terminal 25. In the binary "1" state the resistance of the output photoconductor 24 is quite low and as a result, the current change $I_T$ at the output terminal 25 is quite substantial. When, however, the bistable strata 17 does not luminesce (binary "0") the resistance of the output photoconductor 24 is quite high and the current change $I_T$ at the output terminal 25 is quite low.

Referring now to FIGS. 4 and 5 there is illustrated another embodiment of the bistable switch 16 including preferred features therefor. Structurally, the bistable strata 17, the write strata 18 and the read strata 19 are arranged in the same order and function in the same manner as described and illustrated in FIG. 3. Therefore, similar stratums are identified consistently by the same reference character. The main difference between the embodiments is that the electrical signals $V_F$ and $V_R$ are applied laterally across the surfaces of the bistable photoconductor 21 and the output photoconductor 24 respectively rather than normally therethrough. Structurally, the electrical signal supply conductors 51–52 and 53–54 of beryllium-copper each include complementary pairs of fingered electrodes in which the fingers extend across the surface of the photoconductor from opposite sides thereof in an interlocking spaced-apart relationship (FIG. 5*a*). For example, when luminescence is supplied to the surface of the photoconductor 24 the resistance thereat decreases thereby causing a substantial increase in the current flowing from conductor 51 to ground through the complementary conductor 52. For optical transmission the space between the complementary fingers can be filled with a thin film layer of transparent insulated material or left as a vacuum. The upper surface of the bistable switch is covered with an opaque conductor 56, thus isolating the circuit from ambient light.

The lower complementary pair of fingered electrodes 53–54 differ from the above described pair of electrodes 51–52 in that they supply electrical current across both the upper and the lower surfaces of the bistable photoconductor 21. Thus, since both sides of bistable photoconductor 21 can be illuminated, either side will conduct current independent of the other side.

To accomplish this dual side conduction the individual fingers are split horizontally forming a cavity large enough to receive the photoconductor layer 21 while contacting both sides thereof.

Although the fingers have been illustrated in cross section as extending along the surface of the photoconductor 24 (FIG. 5*b*), it should be understood that appropriate thin film techniques could be used in which the fingers would be embedded in the photoconductive material.

In the particular embodiment illustrated, the fingered electrode pairs 51–52 and 53–54 are electrically insulated from the rest of the thin film circuit by semitransparent insulator layers 43, and 35*a* and 35*b*, respectively. As described with relation to the preceding embodiment, the electrode layers adjacent the electroluminescent members (EL) are also semitransparent, thus providing optical coupling between the photoconductive layers (PC) and the electroluminescent layers (EL). In addition, the thin film layers are optically isolated from ambient light by an opaque insulator layer 56 and the surrounding opaque layers of conductors and insulators.

Operationally, the bistable switch 16 of FIG. 4 would function in the same manner as the previously described switches as the voltage signals $V_F$, $V_W$ and $V_R$ are applied thereto. Thus, a detailed description of the operation of the switch is not necessary.

Referring now to FIG. 6, the above-described fingered current supply means 51–52 could be used in an electroluminescent photoconductive thin film switch 57 which in turn could be constructed into a bistable switch of the type shown in FIG. 7. An advantage of these switches is that few layers are required and that the manufacturing problems are decreased accordingly. Structurally, the switch 57 includes an electroluminescent layer 58 and a photoconductive layer 59 stacked in a laminae or strata of semitransparent electrodes, insulators and conductors. As described with reference to FIG. 3 the switch 57 is encased within an opaque laminae of conductors and insulators and capped with an opaque insulator 56 thereby isolating the switch from ambient or stray light. In operation the state of the electroluminescent member or layer 58 is controlled by a voltage signal $V_{in}$ supplied through an opaque conductor stratum 61 to create an electrical field between an opaque electrode 62 and the semitransparent electrode 63 which sandwich the electroluminescent stratum 58. The semitransparent electrode stratum 63 is maintained at ground potential by an opaque conductor 64 connected to the side thereof. The luminescence from the electroluminescent layer 58 is conducted or coupled upwardly to the photoconductive layer 59 through the semitransparent electrode 63 and a semitransparent insulator 66.

The luminescent state of the electroluminescent layer 58 is determined by interrogating the photoconductor layer 59 with a voltage signal $V_I$ and measuring the corresponding voltage change $V_{out}$ at terminal 67. Structurally, the conductor pair 51–52 is the same as the complementary pair of fingered electrodes 51 and 52 illustrated in FIGS. 4, *5a* and *5b*. Thus, when luminescence of the electroluminescent layer 58 shines through the space between fingers, current is conducted from the fingers of one conductor 51 to the fingers of the other conductor 52 along the surface of photoconductive layer 59. When, however, electroluminescent member 58 is not luminescent the resistance at the surface of the photoconductor layer 59 is high and any voltage change $V_{out}$ at terminal 67 is slight.

An advantage of these switching units 57 is that they can be fabricated into more complex circuits such as a bistable switch 71 illustrated in FIG. 7 with the use of fewer layers. This bistable switch 71 includes three electroluminescent-photoconductive switches **57*a*, 57*b* and 57*c* which are electrically coupled together to operate in the same manner as the bistable switch of FIG. 1. The bistable branch includes the electroluminescent members 72 and 73 of switch 57*b* and switch 57*c*, respectively, connected in parallel with one another and in series with photoconductive elements 74 and 77 of switches 57*b* and 57*a***, respectively. An electrical signal $V_F$ is selectively applied across these elements to maintain the bistable branch in the bistable operational range previously described with reference to FIG. 1.

To determine or set the state of the bistable branch, a write signal $V_W$ is applied to the write branch which includes an electroluminescent member 76 of the switch **57*a*. Thus, when the electroluminescent member 76 luminesces it is optically coupled to decrease the resistance in the photoconductor 77 which is in turn connected in parallel or shunt with the bistable branch photoconductor 74. As a result the resistance of the bistable branch decreases, thereby increasing the electrical field across the parallel electroluminescent members 72 and 73. When the bistable electroluminescent member 72 luminesces the light is optically coupled to the photoconductor 74** to hold or maintain the bistable branch in a binary "1" condition even after the write signal $V_W$ is removed from the write branch.

The luminescence from the other electroluminescent member 73 in the bistable branch is optically coupled to control the resistance of an output photoconductor 78 in the read branch. Thus, when the read branch is interrogated with a read signal $V_R$ a corresponding voltage change $V_T$ occurs at the output terminal 79.

In the binary "0" condition the bistable electroluminescent members 72 and 73 of the bistable branch are in their dark condition, and as a result the resistance of the optically coupled output photoconductor 78 is high. Thus, when the read branch is interrogated with a read signal $V_R$ the increasing voltage change $V_T$ at the output terminal 79 is quite low because of the voltage dividing action across an output circuit (not shown).

Still another bistable switch 81 is illustrated in FIG. 8. Structurally, this bistable switch 81 differs from the bistable switch of FIG. 1 in that one lead of an electroluminescent member 82 in the write branch is connected to the input lead of the bistable branch rather than to a ground terminal. Operationally in the quiescent state the write signal $V_W$ is at a value ½ E for a binary "0" condition and at E volts for a binary "1" condition. The electrical signal $V_F$ to the bistable branch is at E volts sufficient to bistably operate the electroluminescent member 83 and photoconductive member 84 in the manner previously described with reference to FIG. 1. The read signal $V_R$ is also at 0 volts during the quiescent conditions.

To accomplish the bistable switching operations the electrical signals $V_W$, $V_F$ and $V_R$ can be applied to the bistable switch 81 in the exemplary manners illustrated in the voltage timing graphs of FIGS. *9a* and *9b*. For a binary "0" condition the write voltage $V_W$ is at ½ E volts which is insufficient to cause the write electroluminescent member to luminesce negligibly. The read signal $V_R$ across the read branch 86 is reduced to 0 volts. Thereafter the bistable switch 81 is emptied by decreasing the electrical signal $V_F$ across the bistable branch from E volts to 0 volts. After the bistable electroluminescent member 83 and the bistable photoconductor 84 have attained their dark values the bistable branch can be reset by increasing the electrical signal $V_F$ to E volts. Since the write signal $V_W$ is at ½ E volts the amount of luminescence created at electroluminescent member 82 is insufficient to substantially decrease resistance of the optically coupled bistable photoconductor 84. Therefore, the electrical field across the bistable electroluminescent member 83 remains too low to create luminescence. The end result is that the resistance of the output photoconductor 87 in the read branch remains high so that interrogation of the output branch 86 with a read pulse $V_R$ results only in a small current change $I_T$ at the output terminal 88 because of the current dividing action between the output photoconductor and the transistor amplifier circuit 89.

For binary "1" conditions the write signal $V_W$ is at E volts which is sufficient to cause the write electroluminescent member 82 to luminesce when the electrical signal $V_F$ to the bistable branch is reduced to "0." The luminescence from the write electroluminescent member 82 is optically coupled to decrease the resistance of the bistable photoconductor 84 thereby increasing the electrical field across the bistable electroluminescent member 83. When the bistable switch 81 is reset, the voltage $V_F$ is returned to E volts. A portion of the luminescence from the bistable electroluminescent member 83 is optically coupled to maintain the bistable photoconductor 84 at a low resistance thereby holding the bistable branch in the reset binary "1" condition. When the electrical signal $V_F$ reaches E volts the electrical field across the write electroluminescent member 82 decreases to "0" volts and the member returns to its dark condition. Thereafter the state of the bistable branch can be determined by interrogating the output branch 86 with a read signal $V_R$. The remaining portion of the luminescence from the bistable electroluminescent member 83 is optically coupled to decrease the resistance of the output photoconductor 87 so that a change in the read voltage $V_R$ results in a corresponding change in the output signal $I_T$ at the outpute terminal 88.

Bistable switches 81 of the above type could be combined into a memory matrix of the type illustrated in FIG. 10. In this memory matrix the individual bistable switches 81 are indicated generally by rectangular blocks. Digital information could be written into the blocks by selectively energizing the X register 92 to selectively generate digital write signals $V_{W1}$, $V_{W2}$ . . . $V_{WN}$ of E volts for a "1" or ½ E volts for a "0." With the digital information so determined random access to the individual rows can be gained by using access inputs $V_{Fa}$, $V_{Fb}$ . . . and a Y register 94 in accordance with the pulse techniques of FIGS. *9a* and *9b*. These registers are of the type conventionally found in memory core matrices presently being used in computers.

In operation, as previously discussed, the digital information from the X-register 92, $V_W$ would be E volts for a binary "1" and ½ E volts for a binary "0." Thus consider $V_{W1}$ to be at E volts "1" and $V_{W2}$ to be at ½ E volts "0" for a binary "10 . . ." word. The read signal $V_R$ received from the Y-register 94 is then reduced to 0 volts on all rows so that any change in the state of an individual bistable switch or memory store 81 as it is emptied and reset will not register an output signal $V_T$. Thereafter, the reset signals $V_F$ to the bistable switches of a particular row to which access is to be gained is reduced to 0 volts while the reset signal $V_F$ to the remaining rows is left at E volts.

For instance, if access is to be gained to row *"a"* the reset voltage $V_{Fa}$ would be reduced to 0 volts while the reset voltage $V_{Fb}$ would remain at E volts. When the reset signal $V_{Fa}$ goes to 0 any information stored on the bistable branch is emptied from the bistable switches 81 and the information $V_{W1}$ and $V_{W2}$ from the X-register is written and stored on the bistable switches 81.

Referring back to the structure of FIG. 8, this storage function is accomplished as the potential across the write electroluminescent member 82 determines the bistable state of the bistable branch. For a binary "1" ($V_W=E$ volts) the potential across the write electroluminescent member 82 goes to E volts when $V_F$ goes to zero volts causing it to luminesce. The luminescence from the write electroluminescent member 82 is optically coupled to decrease the resistance of bistable photoconductor thereby decreasing the resistance in the bistable branch.

For a binary "0" ($V_W=½\ E$ volts) the potential across the write electroluminescent member 82 when the signal $V_F$ goes to zero volts does not become great enough to cause substantial write luminescence and the resistance of the bistable branch remains high. Thereafter, the reset signal $V_{Fa}$ is again raised to E volts whereupon, in column 1 row *"a,"* the bistable electroluminescent member 83 luminesces to maintain the resistance of bistable photoconductor low thereby holding the bistable branch in the ON or binary "1" condition. At the same time, in column 2 row *"a,"* the potential across the write electroluminescent member 82 is still ½ E volts with a mere reversal in polarity. As a result, the luminescence is still too low to change the resistance of the bistable photoconductor 84 and it remains in the dark high resistance state for a binary "0." To interrogate the entire *"a"* row the read signal $V_R$ is increased to E volts, thereby generating an output current change $I_T$ which has a magnitude dependent upon the state of the binary switch in the particular column and row. Thus, whenever a bistable element is interrogated its state is nondestructively read out.

While the salient features of the invention have been illustrated and described with respect to particular embodiments, it should be readily apparent that numerous modifications may be made within the spirit and scope of the invention and it is therefore not desired to limit the invention to the exact details shown.

What is claimed is:

1. A bistable switch of superposed thin film layer comprising: a bistable strata having an electroluminescent layer and a photoconductive layer optically and electrically coupled to one another, said bistable strata being adapted to receive an electrical signal of a predetermined magnitude applied thereto; a write strata including an electroluminescent layer which is optically coupled to said photoconductive layer of said bistable strata, said write strata being adapted to receive an electrical signal applied thereto to turn on or turn off said electroluminescent layer of said write strata depending upon the magnitude of the pulse signal whereby the luminescence so created is optically coupled to said photoconductive layer to selectively determine the luminescent state of said bistable strata; a read strata including a photoconductive layer which is optically coupled to said electroluminescent layer of said bistable strata; and a first pair and a second pair of complementary fingered electrode means connected to extend across all illuminated faces of said individual ones of said photoconductive layers respectively with the fingers thereof in an interspaced relationship to one another whereby the luminescence from said electroluminescent layers is optically coupled to decrease the resistance of the photoconductive material for increased resultant current flow between complementary fingers parallel to the surface of said photoconductive layers.

2. A bistable switch of superposed thin film layer comprising: a bistable strata having an electroluminescent layer and a photoconductive layer each optically coupled to one another, said bistable strata being adapted to receive an electrical signal of a predetermined magnitude applied thereto; a write strata including an electroluminescent layer which is optically coupled to said photoconductive layer of said bistable strata, said write strata being adapted to receive an electrical signal applied thereto to turn on or turn off said electroluminescent layer of said write strata depending upon the magnitude of the electrical signal whereby the luminescence so created is optically coupled to said photo-conductive layer to selectively determine the luminescent state of said bistable strata; a read strata including a photoconductive layer which is optically coupled to said electroluminescent layer of said bistable strata; and a first pair and a second pair of complementary fingered electrode means each connected to extend across all illuminated faces of said individual ones of said photoconductive layers respectively with the fingers thereof in an interspaced relationship to one another whereby the luminescence from said electroluminescent layers is optically coupled to decrease the resistance of the photoconductive material for resultant current flow between complementary fingers parallel to the surface of said photoconductive layers.

3. A bistable switch comprising: a bistable branch having an electroluminescent portion and a photoconductive portion each electrically and optically coupled to one another, said bistable branch having an input terminal and being adapted to have a first electrical signal of a predetermined magnitude applied thereacross from said input terminal; a write branch including an electroluminescent portion which is optically coupled to said photoconductive portion of said bistable branch, said write branch having an input terminal and being adapted to receive a second electrical signal applied thereto from an input terminal end, the other terminal end thereof being connected to the input terminal of said bistable branch whereby said electroluminescent portions of said write branch and said bistable branch are turned on by the application of the second electrical signal and said electroluminescent portion of said bistable branch is held on by the subsequent application of the first electrical signal; and means coupled to interrogate the state of said bistable branch.

4. A bistable switch comprising: a bistable branch having an electroluminescent portion and a photoconductive portion each optically coupled to one another, said bistable branch having an input terminal; a first means for applying an electrical signal of a predetermined magnitude to the input terminal of said bistable branch for setting the stable state thereof; a write branch including an electroluminescent portion which is optically coupled to said photoconductive portion of said bistable branch, said write branch having an input terminal and being adapted to receive an electrical signal applied to an input terminal end, the other terminal end thereof being connected to said input terminal of said bistable branch; a second means connected to apply an electrical signal to the input terminal of said write branch, the magnitude of the pulse signal being about one-half the magnitude of the electrical signal applied to the bistable branch for a binary "0" condition and about the magnitude of the electrical signal applied to the bistable branch for a binary "1" condition, whereby said electroluminescent portion of said write branch is turned on when the electrical field thereacross exceeds a predetermined potential and is turned off when the electrical field thereacross falls below a predetermined magnitude and the luminescence so created is optically coupled to said photoconductive portion of said bistable branch to select the state of said electroluminescent portion of said bistable branch; and means coupled to interrogate the state of said bistable branch.

5. A thin film bistable switch comprising: a bistable strata having an electroluminescent layer and a photoconductive layer said layers being electrically and optically coupled to one another, said bistable strata being adapted to receive an electrical reset signal of a predetermined magnitude applied thereacross from an input terminal; a write strata including a electroluminescent layer which is optically coupled to said photoconductive layer of said bistable strata, said write strata having an input terminal for receiving an electrical write signal and a second terminal connected to the input terminal of said bistable strata for selectively receiving an electrical signal for creating an electrical field across said electroluminescent layer and turning on or turning off said electroluminescent layer of said write strata depending upon the resultant magnitude of the electrical write signal and the reset signal, the luminescence so created being optically coupled to said photo-conductive layer for setting the state of said electroluminescent layer of said bistable strata when the electrical reset signal is applied thereto; and a read strata including a photoconductive layer which is optically coupled to said luminescent layer of said bistable strata, said read strata being adapted to be interrogated by a read pulse signal to conduct a signal across said photoconductive layer of a magnitude which is dependent upon the luminescent state of said bistable layer.

6. In a memory matrix of the type having an X register, a Y register and an access means for obtaining an access to predetermined rows of the memory, a plurality of bistable devices each comprising: a bistable branch having an electroluminescent portion and a photoconductive portion each optically and electrically coupled to one another, said bistable branch being adapted to have an electrical signal of a predetermined magnitude applied thereacross from an input terminal connected in circuit with the access means; a write branch including an electroluminescent portion which is optically coupled to said photoconductive portion of said bistable branch, said write branch being adapted to receive an electrical signal applied thereto from an input terminal end connected in circuit to one of the registers, the other terminal end thereof being connected to said input terminal of said bistable branch, said electroluminescent portion of said write branch being turned on when the electrical field thereacross exceeds a predetermined magnitude and being turned off when the electrical field thereacross falls below a predetermined magniture whereupon the luminescence so created is optically coupled to said photoconductive portion to select the stable state of said electroluminescent portion of said bistable branch; and means coupled to interrogate the state of said bistable branch, said means being coupled to the other register.

References Cited

UNITED STATES PATENTS

| | | | |
|---|---|---|---|
| 3,042,807 | 7/1962 | Vize | 250—213 |
| 3,056,887 | 10/1962 | Diemer et al. | 250—213 |
| 3,163,763 | 12/1964 | Bray et al. | 250—213 |
| 3,163,764 | 12/1964 | Blank | 250—213 |
| 3,193,805 | 7/1965 | Gnuse | 250—213 |

RALPH G. NILSON, *Primary Examiner.*

M. ABRAMSON, *Assistant Examiner.*